(12) United States Patent
Lian et al.

(10) Patent No.: US 7,705,707 B2
(45) Date of Patent: Apr. 27, 2010

(54) BISTABLE MICROELECTRONIC SWITCH STACK

(75) Inventors: Ke K. Lian, Palatine, IL (US); John B. Szczech, Schaumburg, IL (US); Jie Zhang, Buffalo Grove, IL (US)

(73) Assignee: Motorola, Inc., Schaumburg, IL (US)

( * ) Notice: Subject to any disclaimer, the term of this patent is extended or adjusted under 35 U.S.C. 154(b) by 795 days.

(21) Appl. No.: 11/614,449

(22) Filed: Dec. 21, 2006

(65) Prior Publication Data

US 2008/0150672 A1   Jun. 26, 2008

(51) Int. Cl.
    *H01C 7/10* (2006.01)
(52) U.S. Cl. .................. 338/20; 365/163; 365/151; 345/107; 427/126.1; 257/4; 257/314
(58) Field of Classification Search ............... 338/20; 365/163, 171, 151, 153, 158; 345/107; 427/126.1; 257/4, 314, 326, 411, 366
See application file for complete search history.

(56) References Cited

U.S. PATENT DOCUMENTS

| | | | |
|---|---|---|---|
| 3,976,811 A * | 8/1976 | DeTommasi | 427/58 |
| 6,128,214 A | 10/2000 | Kuekes et al. | |
| 6,297,987 B1 * | 10/2001 | Johnson et al. | 365/158 |
| 6,768,157 B2 | 7/2004 | Krieger et al. | |
| 6,809,362 B2 * | 10/2004 | Gilton | 257/296 |
| 6,912,147 B2 * | 6/2005 | Campbell et al. | 365/113 |
| 7,120,047 B2 * | 10/2006 | Segal et al. | 365/151 |
| 7,276,722 B2 * | 10/2007 | Gilton | 257/2 |
| 2003/0156603 A1 | 8/2003 | Rakib et al. | |
| 2008/0152792 A1 | 6/2008 | Lian | |

OTHER PUBLICATIONS

Moller, et al., "A polymer/semiconductor write-once read-many-times memory," Nature publishing Group, Letters to Nature, Nature, vol. 426, Nov. 13, 2003, pp. 166-169.

Venkatesan, et al., "Tapping ZettaRAM for Low-Power Memory System," IEEE Proceedings of the 11th Symposium on High-Performance Computer Architecture 2005 (HPCA 2005), Nov. 2005, 12 pages.

Yang, et al., "Electrical Switching and Bistability in organic/Polymeric Thin Films and Memory Devices," Advanced Functional Materials, vol. 16, 2006, 1001-1014.

Wikipedia, "Phthalocyanine," Wikipedia, the free encyclopedia, Downloaded Feb. 23, 2009, 5 pages.

Duncan Stewart, "Electrical Switching in Metal / Molecule / Metal Devices," Hewlett-Packard Labs, Palo Alto, CA, USA, Hewlett-Packard Development Company, L.P., 2003, 61 pages.

Tondelier, et al., "Metal / Organic / Metal Bistable Memory Devices," Applied Physics Letters, vol. 85, No. 23, Dec. 6, 2004, pp. 5763-5765.

Lai, et al., Bistable Resistance Switching of Poly(N-vinylcarbazole) Films for Nonvolatile Memory Applications, Applied Physics Letters, vol. 87, Sep. 12, 2005, pp. 122101-1 thru 122101-3.

(Continued)

*Primary Examiner*—Kyung Lee

(57) ABSTRACT

A stack for a bistable microelectronic switch. A porphyrin compound and a conductive polymer are sandwiched between two electrodes. The device exhibits a switching behavior at a certain voltage and can be used in arrays to form a memory device. When a first voltage is applied between the electrodes, the resistance across the two electrodes is very high, and when a increased voltage is applied, the resistance is generally two orders of magnitude lower. Copper phthalocyanine or 5, 10, 15, 20-tetrakis(4-methoxyphenyl)-21H, 23H-porphine cobalt(II) can be used as the bistable compound, and poly-(3,4-ethylenedioxythiophene) and poly-(styrenesulphonic acid) can be used as the conductive polymer.

20 Claims, 3 Drawing Sheets

OTHER PUBLICATIONS

Oyamada, et al., "Switching Effect in Cu: TCNQ Chage Transfer-Complex Thin Films by Vacuum Codeposition," Applied Physics Letters, vol. 83, No. 6, Aug. 11, 2003, pp. 1252-1254.

Ma, et al., Organic Electrical Bistable Devices and Rewritable Memory Cells, Applied Physics Letters, vol. 80, No. 16, Apr. 22, 2002, pp. 2997-2999.

Elsharkawi, et al., "Switching and Memory Phenomena in Anthracene Thin Films," Journal of Physics and Chemistry of Solids, vol. 38, Issue 1, 1977, Pergamon Press, Great Britain, pp. 95-96.

Cormen, et al., "Section 9.2: Counting Sort," Introduction to Algorithms, Sixth Printing, 1992, The MIT Press. Relevant to claims 1-10.

* cited by examiner

BISTABLE MICROELECTRONIC SWITCH STACK

FIELD OF THE INVENTION

The present invention relates generally to switching devices, and more particularly to microelectronic switching devices having an organic switching layer.

CROSS REFERENCE TO RELATED APPLICATION

The present invention is related to Ser. No. 11/614,472, METHOD OF MANUFACTURING A BISTABLE MICROELECTRONIC SWITCH STACK, filed on even date herewith and having common assignee.

BACKGROUND

Organic devices promise to revolutionize the extent of, and access to, electronics by providing extremely inexpensive and lightweight components that can be fabricated onto plastic, glass or metal foils. One key component of an electronic circuit that has thus far received surprisingly little attention is an organic electronic memory. Some have devoted attention to devices such as a write-once read-many-times (WORM) memory, based on the hybrid integration of an electrochromic polymer with a thin-film silicon diode deposited onto a flexible metal foil substrate. WORM memories are desirable for ultra low-cost permanent storage of digital images, eliminating the need for slow, bulky and expensive mechanical drives used in conventional magnetic and optical memories. Although some have successfully demonstrated that such devices are feasible, they remain expensive and difficult to manufacture. Others have utilized nano-scale materials to create memory devices, but they too remain out of reach for practical, large scale application.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
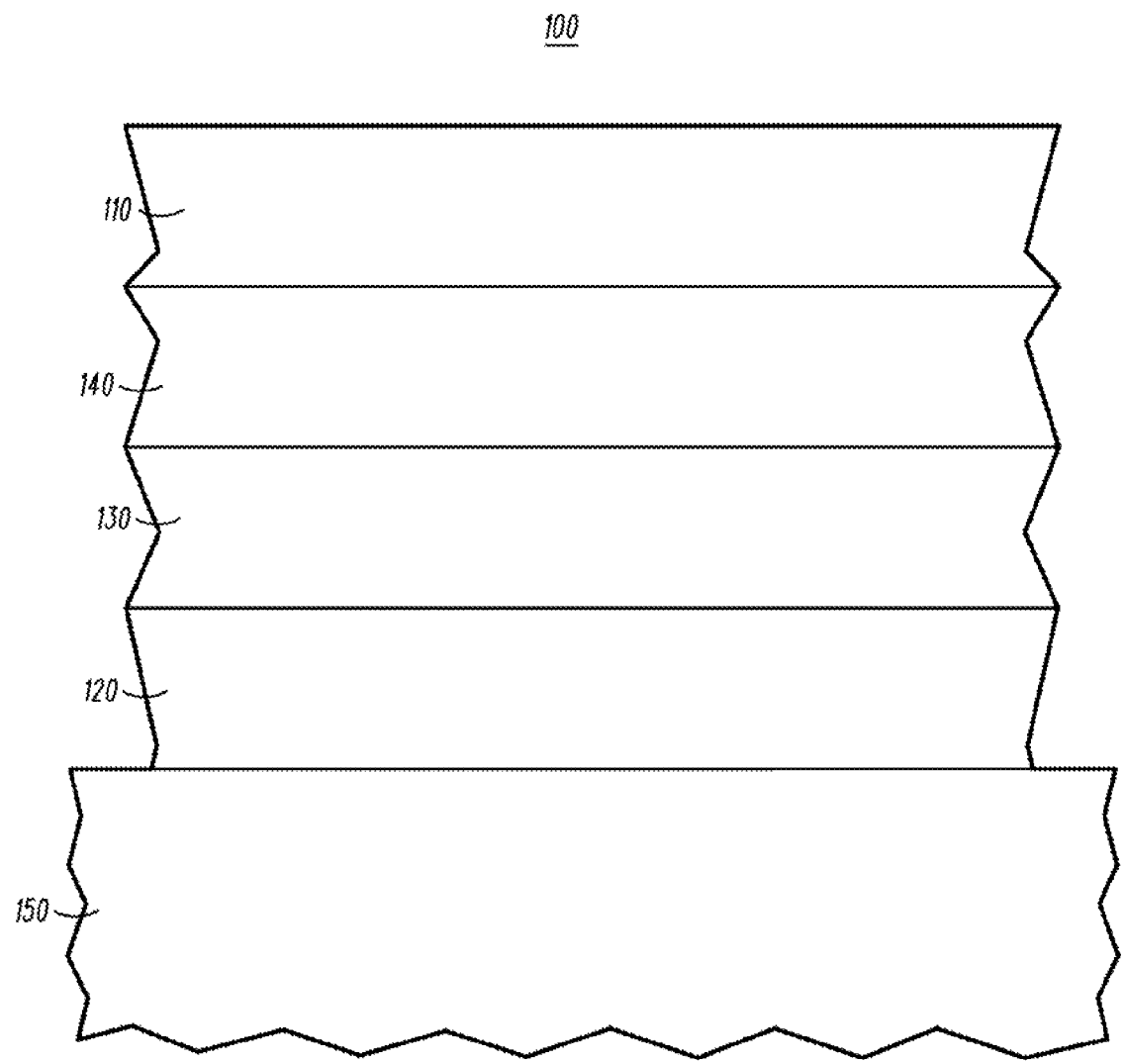
FIG. 1 is partial cross-sectional view of a bistable microelectronic switch stack, in accordance with some embodiments of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of method and apparatus components related to a stack for a bistable microelectronic switch. Accordingly, the apparatus components and methods have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

It will be appreciated that embodiments of the invention described herein may be comprised of one or more conventional elements, materials, or processes, that, combined in a novel manner, provide a stack for a bistable microelectronic switch described herein. Thus, methods and means for these functions have also been described herein. Further, it is expected that one of ordinary skill, notwithstanding possibly significant effort and many design choices motivated by, for example, available time, current technology, and economic considerations, when guided by the concepts and principles disclosed herein will be readily capable of generating such stacks with minimal experimentation.

A stack for a bistable microelectronic switch contains a first electrode, a bistable porphyrin compound on the first electrode, a conductive polymer over the bistable porphyrin compound, and a second electrode on the conductive polymer. When a voltage greater than zero and less than about 2 volts is applied between the first electrode and the second electrode, the resistance across the two electrodes is very high, and when a voltage of greater than about 2 volts is applied, the resistance is generally two orders of magnitude lower. The stack is generally formed on a supporting substrate, so that the first electrode is situated on the supporting substrate. One embodiment of the stack uses copper phthalocyanine as the bistable compound, and poly-(3,4-ethylenedioxythiophene) and poly-(styrenesulphonic acid) as the conductive polymer. One application of the switch is use in a random access memory stack device. When a voltage greater than zero is applied between the first electrode and the second electrode, the resistance across the two electrodes is very high, and when a higher voltage is applied, the resistance is generally two orders of magnitude lower.

Referring now to FIG. 1, a bistable switch stack 100 for use in microelectronics applications has a top electrode 110, a bottom electrode 120, an organic bistable layer 130 and a conducting polymer 140 sandwiched between the two electrodes. When a voltage or field is applied to the two electrodes, the organic bistable layer changes impedance at a certain voltage, changing from diode-like behavior (Schottky contact with very high resistance) to resistor-like behavior (ohmic contact with resistances about 2 or more orders of magnitude lower). Normally, the stack would be built upon a supporting substrate 150, such as a flexible polymer, glass-reinforced polymers, ceramic, or silicon, but one could also fabricate the stack on a releasable substrate, which would be peeled away after the stack is complete. The bottom electrode 120 is preferably made of copper, but could also be other materials or metals such as aluminum, gold, silver, titanium, nickel, carbon and carbon nanotubes. The organic bistable layer 130 is a macrocyclic compound, generally of the porphyrin family. We find that 5, 10, 15, 20-tetrakis(4-methoxyphenyl)-21H,23H-porphine cobalt(II), copper phthalocyanine, and salts thereof are particularly effective.

The bistable layer is situated in a continuous layer over the bottom electrode 120. The conducting polymer 140 is a combination of poly-(3,4-ethylenedioxythiophene) and poly-(styrenesulphonic acid), also known as PEDOT:PSS, and is a continuous layer on the bistable layer 130. Overlying the conductive polymer layer is a top electrode 110, which is preferably made of an electrically conducting ink containing copper, nickel, carbon, or carbon nanotubes.

Figure 2:
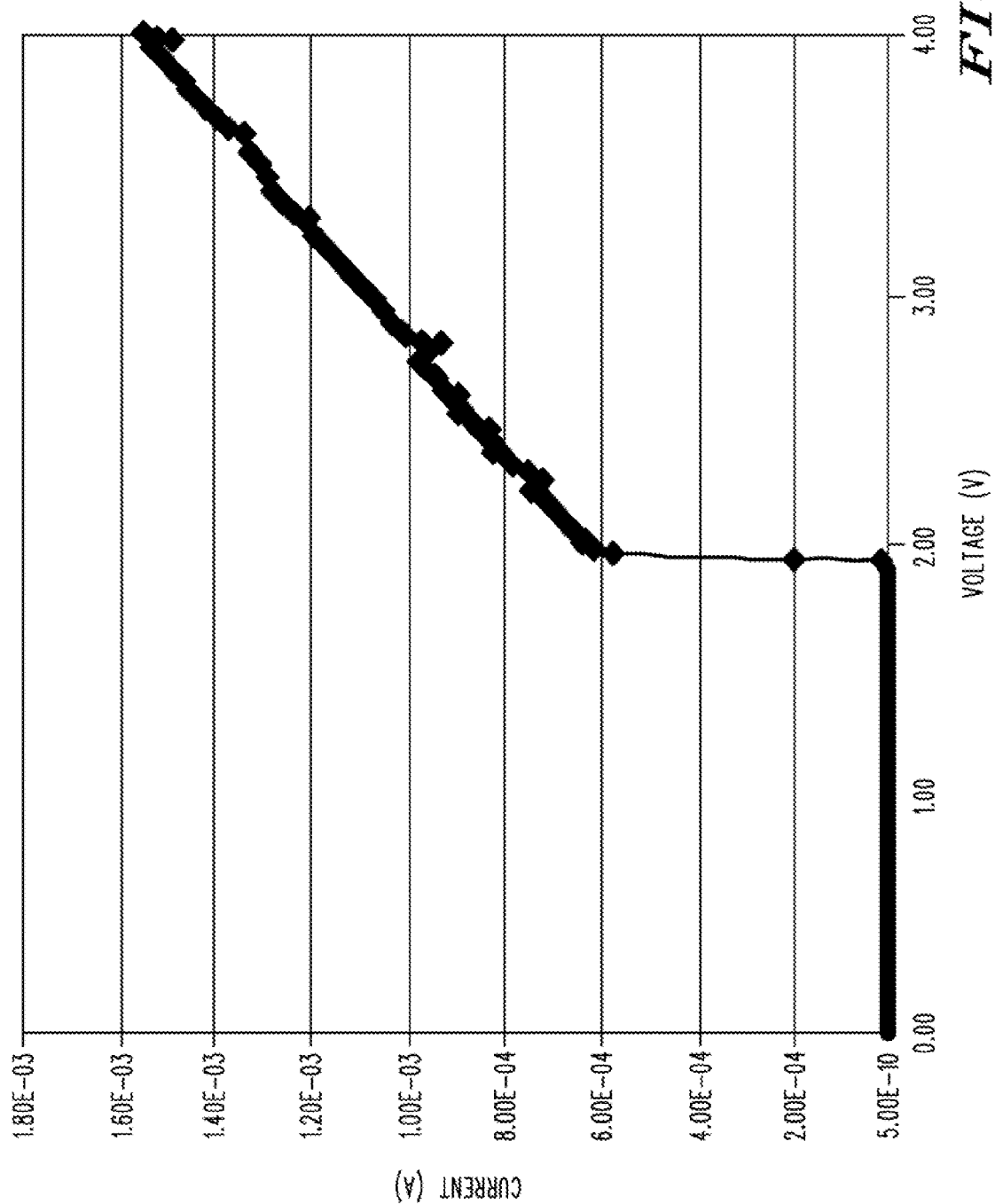
FIG. 2 is a graph of voltage vs. current for a bistable microelectronic switch stack, in accordance with some embodiments of the invention.

Referring now to FIG. 2, when a voltage less than a switching voltage, defined herein as the voltage level where the bistable molecule changes conductivity, typically between about 1.5 volts and 2 volts for copper phthalocyanine, is applied between (i.e. across) the electrodes 110, 120, the impedance, and therefore the amount of current that can be conducted between the electrodes, is very low. At voltages between zero and the switching voltage, the impedance remains relatively constant until, at the switching voltage, the bistable macrocyclic compound undergoes a reversible electrochemical redox reaction and the impedance changes significantly. We have observed impedance changes from about two orders of magnitude (100 times) to about 4 orders of magnitude (10,000 times). The amount of current that can be conducted across the two electrodes increases in a step function manner by multiple orders of magnitude at the switching voltage, then proceeds to climb in a linear fashion as the voltage is increased further. The actual value of the switching voltage varies as a function of the particular bistable macrocyclic compound employed and also as a function of the thickness of the bistable layer. For example, although copper phthalocyanine exhibited a switching voltage between about 1.5 volts and 2 volts the observed switching voltage for 5, 10, 15, 20-tetrakis(4-methoxyphenyl)-21H,23H-porphine cobalt (II) was between about ±4 and ±5 volts.

Below the switching voltage, the stack 100 behaves electrically like a diode, that is, essentially non-conducting. Once the switching voltage is reached, the stack changes and now behaves electrically like a fixed resistor, where the amount of current that can be conducted is a direct function of the voltage, per Ohm's Law. Once the voltage field is removed, the stack remains at the "switched" behavior in a resistive state. That is, the bistable macrocyclic compound does not revert, until a lower voltage is presented.

Figure 3:
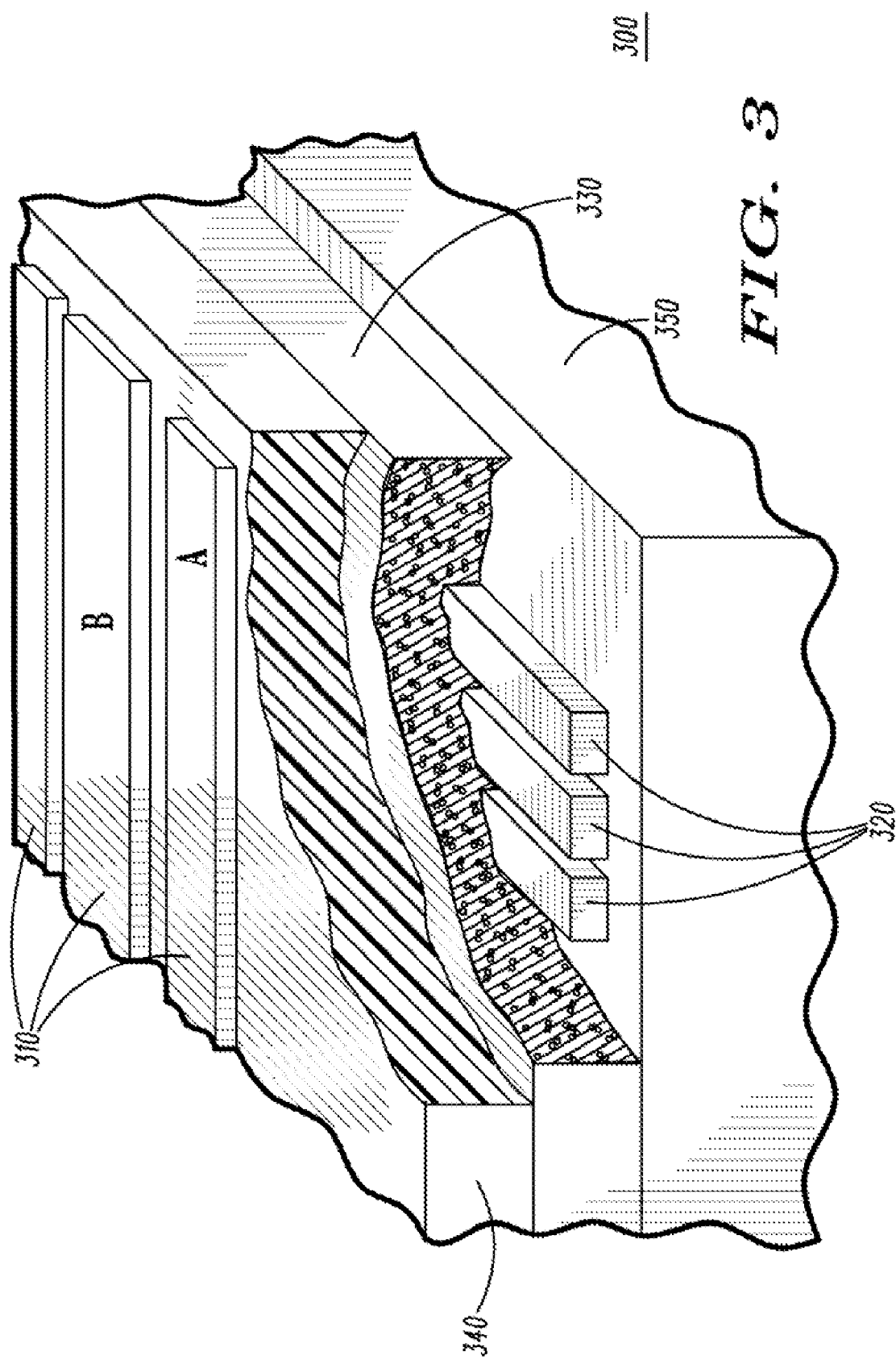
FIG. 3 is partial isometric view of an array of bistable microelectronic switches, in accordance with some embodiments of the invention.

Referring now to FIG. 3, an alternate embodiment of our invention finds the bistable switch described above arranged in an array to create a memory device 300, such as a random access memory. A plurality of bottom or lower electrodes 320 are arranged on a substrate 350 in an array. Although the drawing figure shows the electrode array as one dimensional, wherein the electrodes are a series of lines that are parallel to each other, it can also be a two dimensional array, where the electrodes are formed in a shape and repeated in a regular or irregular pattern. Optionally, the individual electrodes in the array can be connected to a common bus. Overlying the electrodes 320 is a layer of an organic bistable material 330 such as a macrocyclic compound, generally of the porphyrin family. We find that 5, 10, 15, 20-tetrakis(4-methoxyphenyl)-21H,23H-porphine cobalt(II), and salts thereof are particularly effective. On top of the organic bistable material 330 is a layer of conducting polymer 340, such as PEDOT:PSS. A top or upper array of electrodes 310 is situated on the conducting polymer 340. In the case where the bottom electrodes 320 are arranged in a one dimensional array, (i.e. a series of parallel lines or strips), the top electrode array is, preferably, likewise a one dimensional array, with the lines situated orthogonally to the bottom electrodes. Optionally, one could arrange the lines at other angles that are not right angles. This "crossbar" arrangement provides a matrix of uniquely addressable locations at the intersection of each upper and lower electrode. Due to a donor-acceptor charge transfer mechanism, an anisotropic conduction path between the intersection of the lower electrode and the upper electrode is created via a "most preferred" path. That is, the conductive path is vertical from a lower electrode to an upper electrode, and does not cross horizontally or at an angle to another adjacent electrode on either layer. Devices built in this manner with a common bottom electrode 320 and common bistable layer 330 were subjected to writing cycles at locations "A" and "B" in FIG. 3 by varying the voltage past the switching voltage, and the two switches A and B exhibited independent behavior. That is, writing (applying the switching voltage) at location A did not affect the value of location B, and vice versa.

In summary, a bistable microelectronic switch utilizing a porphyrin compound and a conductive polymer sandwiched between two electrodes exhibits a switching behavior at a certain voltage. It can be used in arrays to form a memory device.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

What is claimed is:

1. A bistable microelectronic switch, comprising:
a first electrode;
a bistable macrocyclic compound situated on the first electrode;
a conductive polymer situated on the bistable macrocyclic compound; and
a second electrode situated on the conductive polymer.

2. The bistable microelectronic switch as described in claim 1, wherein the first electrode comprises one or materials selected from the group consisting of copper, aluminum, gold, silver titanium, nickel, carbon, and carbon nanotubes.

3. The bistable microelectronic switch as described in claim 1, wherein the second electrode comprises electrically conductive ink filled with one or more materials selected from the group consisting of silver, copper, nickel, carbon and carbon nanotubes.

4. The bistable microelectronic switch as described in claim 1, further comprising a supporting substrate, wherein the first electrode is situated on the supporting substrate.

5. The bistable microelectronic switch as described in claim 4, wherein the bistable macrocyclic compound comprises copper phthalocyanine, the conductive polymer comprises poly-(3,4-ethylenedioxythiophene) and poly-(styrenesulphonic acid), the second electrode comprises silver filled conductive ink, and wherein when a first voltage is applied between the first electrode and the second electrode, the resistance across the two electrodes is a first value, and when a second voltage greater than the first voltage is applied between the first electrode and the second electrode, the resistance across the two electrodes is a second value, wherein the second value is greater than two orders of magnitude less than the first value.

6. The bistable microelectronic switch as described in claim 1, wherein at applied voltages less than ±5 volts the resistance between the first electrode and the second electrode is a first value, and at applied voltages greater than ±5 volts the resistance between the two electrodes is a second value, wherein the second value is greater than two orders of magnitude less than the first value.

7. The bistable microelectronic switch as described in claim 6, wherein when the applied voltage is removed, the resistance does not revert back to the first value.

8. The bistable microelectronic switch as described in claim 1, wherein the bistable macrocyclic compound comprises copper phthalocyanine or 5, 10, 15, 20-tetrakis(4-methoxyphenyl)-21H,23H-porphine cobalt(II).

9. The bistable microelectronic switch as described in claim 1, wherein the conductive polymer comprises poly-(3,4-ethylenedioxythiophene) and poly-(styrenesulphonic acid).

10. A bistable microelectronic switch, comprising:
a plurality of first electrodes arranged in an array and disposed on a substrate;
a bistable macrocyclic compound situated on the plurality of first electrodes;
a conductive polymer situated on the bistable macrocyclic compound; and
a plurality of second electrodes situated on the conductive polymer, substantially orthogonal to the plurality of first electrodes.

11. The bistable microelectronic switch as described in claim 10, wherein at a first applied voltage, the resistance between the first and second electrodes is a first resistance, and at a second applied voltage greater than the first applied voltage the resistance between the electrodes is a second resistance, wherein the second resistance is greater than two orders of magnitude less than the first resistance.

12. The bistable microelectronic switch as described in claim 11, wherein when the applied voltage is removed, the resistance does not revert back to the first value.

13. The bistable microelectronic switch as described in claim 10, wherein the plurality of first electrodes comprises one or materials selected from the group consisting of copper, aluminum, gold, silver, titanium, nickel, carbon, and carbon nanotubes.

14. The bistable microelectronic switch as described in claim 10, wherein the plurality of second electrodes comprises electrically conductive ink filled with one or more materials selected from the group consisting of silver, copper, nickel, carbon, and carbon nanotubes.

15. The bistable microelectronic switch as described in claim 10, wherein the bistable macrocyclic compound comprises copper phthalocyanine or 5, 10, 15, 20-tetrakis(4-methoxyphenyl)-21H,23H-porphine cobalt(II).

16. The bistable microelectronic switch as described in claim 10, wherein the conductive polymer comprises poly-(3,4-ethylenedioxythiophene) and poly-(styrenesulphonic acid).

17. The bistable microelectronic switch as described in claim 10, wherein the bistable microelectronic switch comprises a random access memory device.

18. The bistable microelectronic switch as described in claim 10, wherein the plurality of first electrodes are arranged in a one dimensional array.

19. The bistable microelectronic switch as described in claim 10, wherein the plurality of first electrodes are arranged in a two dimensional array.

20. A bistable microelectronic switch, comprising:
a plurality of first electrodes situated in an array and disposed on a substrate;
a bistable macrocyclic compound situated on the plurality of first electrodes;
a conductive polymer situated on the bistable macrocyclic compound; and
a plurality of second electrodes situated on the conductive polymer, substantially orthogonal and corresponding to the plurality of first electrodes;
wherein when voltage is applied between one of the plurality of first electrodes and a corresponding second electrode, a most preferred conductive path is created between only the two electrodes; and
wherein at a first applied voltage, the resistance across the two electrodes is a first resistance, and at a second applied voltage greater than the first applied voltage, the resistance across the two electrodes is a second resistance, wherein the second resistance is greater than two orders of magnitude less than the first resistance.

* * * * *

UNITED STATES PATENT AND TRADEMARK OFFICE
CERTIFICATE OF CORRECTION

| | | |
|---|---|---|
| PATENT NO. | : 7,705,707 B2 | Page 1 of 1 |
| APPLICATION NO. | : 11/614449 | |
| DATED | : April 27, 2010 | |
| INVENTOR(S) | : Lian et al. | |

It is certified that error appears in the above-identified patent and that said Letters Patent is hereby corrected as shown below:

IN THE CLAIMS

In Column 4, Line 57, in Claim 2, delete "one or materials" and insert -- one or more materials --, therefor.

In Column 4, Line 59, in Claim 2, delete "silver titanium," and insert -- silver, titanium, --, therefor.

In Column 6, Line 3, in Claim 13, delete "one or materials" and insert -- one or more materials --, therefor.

Signed and Sealed this
Twelfth Day of June, 2012

David J. Kappos
*Director of the United States Patent and Trademark Office*